United States Patent [19]
Runyon et al.

[11] Patent Number: 5,646,557
[45] Date of Patent: Jul. 8, 1997

[54] DATA PROCESSING SYSTEM AND METHOD FOR IMPROVING PERFORMANCE OF DOMINO-TYPE LOGIC USING MULTIPHASE CLOCKS

[75] Inventors: Stephen Larry Runyon, Pflugerville; Eric Bernard Schorn, Austin, both of Tex.

[73] Assignee: International Business Machines Corporation, Armonk, N.Y.

[21] Appl. No.: 509,310

[22] Filed: Jul. 31, 1995

[51] Int. Cl.⁶ .................. H03K 19/096; H03K 19/00
[52] U.S. Cl. .................. 326/97; 326/96; 326/98
[58] Field of Search .................. 326/96, 97, 98

[56] References Cited

U.S. PATENT DOCUMENTS

| | | | |
|---|---|---|---|
| 3,646,369 | 2/1972 | Fujimoto | 326/97 |
| 4,700,086 | 10/1987 | Ling et al. | 326/98 |
| 4,780,626 | 10/1988 | Guerin et al. | 326/98 |
| 4,849,658 | 7/1989 | Iwamura et al. | 326/98 |
| 4,899,066 | 2/1990 | Aikawa et al. | 326/98 |
| 5,041,742 | 8/1991 | Carbonaro | 326/98 |
| 5,065,048 | 11/1991 | Asai et al. | 326/98 |
| 5,070,262 | 12/1991 | Hashimoto | 326/98 |

OTHER PUBLICATIONS

*IEEE Journal of Solid–State Circuits*, "Design–Performance Trade–Offs in CMOS–Domino Logic," v sc–21 n2, Apr. 1986, Oklobdzija et al.

*IEEE 1985 Custom Integrated Circuits Conference*, "Design–Performance Trade–Offs in CMOS Domino Logic" Oklobdzija et al.

*Comput. & Elec. Engng.*, "An Improvement for Domino CMOS Logic," v13 n1, 1987, pp. 53–59., Zhang.

*Primary Examiner*—Edward P. Westin
*Assistant Examiner*—Richard Roseen
*Attorney, Agent, or Firm*—Raymond M. Galasso; Jenkens & Gilchrist; Anthony V. S. England

[57] ABSTRACT

A domino logic circuit includes an evaluation circuit for receiving input signals and performing a logic operation on the input signals, a passgate circuit for controlling the transmission of signals to an output circuit and a feedback latch circuit for holding the output of the evaluation circuit for a predetermined portion of a clock cycle. The output circuit may also include a pair of control transistors to allow the output latching circuit to be turned off during the evaluate portion of the clock cycle thus improving the speed of the domino logic circuit. During the first half of the reset portion of each cycle, the output latching circuit is active and allows the circuit to retain its output state. During the time the passgates are turned off, the evaluate circuit is disconnected and may begin resetting. During the second half of the reset portion of the clocking signal, the passgates open, which allows the output stage to be reset. Since the two additional transistors in the output circuit are controlled by the same signals which control the passgates, the circuit is relatively cheap since only the two transistors must be added to the circuit.

4 Claims, 2 Drawing Sheets

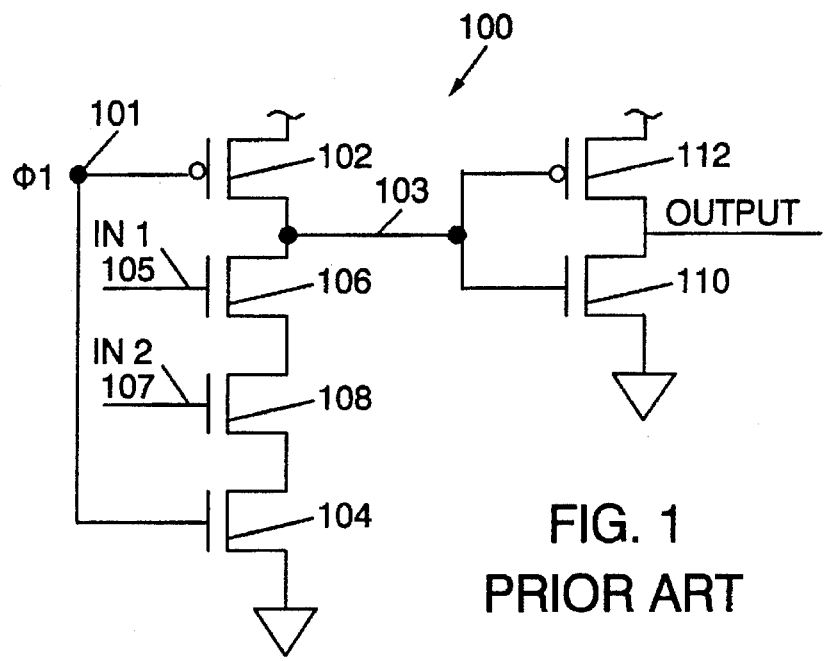
FIG. 1
PRIOR ART
FIG. 4
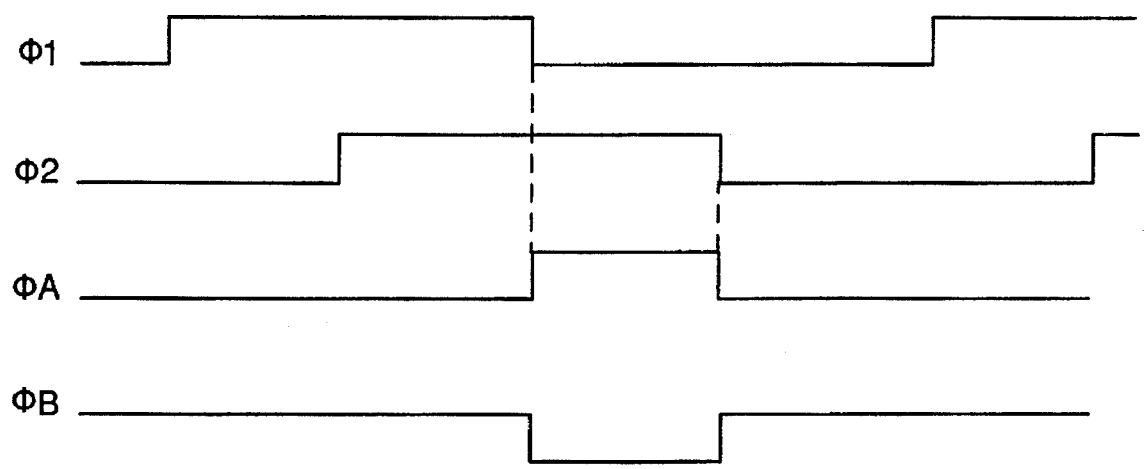

DATA PROCESSING SYSTEM AND METHOD FOR IMPROVING PERFORMANCE OF DOMINO-TYPE LOGIC USING MULTIPHASE CLOCKS

BACKGROUND OF THE INVENTION

1. Field of the Invention

The following invention relates to information handling systems, and more particularly to information handling systems including multiphase clocks.

2. Prior Art

U.S. Pat. No. 4,899,066, entitled "OR-Type CMOS Logic Circuit with Fast Precharging", teaches a complimentary metal oxide semiconductor (CMOS) logic circuit including a signal line OR connecting a plurality of MOS transistors which are turned on and off by a plurality of decoder outputs. The signal line is divided by a MOS-FET in two portions, including a portion on an output side provided with an inverter and an OR connected transistor side, so that respective portions of the signal line as divided are precharged by separate precharging MOS transistors.

While the circuit of the '066 patent has some superficial similarities to embodiments of Applicants' invention, the '066 patent is a point of departure since it does not include essential elements of Applicants' invention.

U.S. Pat. No. 4,700,086, entitled "Consistent Precharge Circuit for Cascode Voltage Switch Logic", teaches a precharge circuit for a cascode voltage switch in which, at the beginning of the precharge phase, the output state is memorized and the output is isolated from the precharging points. Both the positive and negative ends of the discharge paths are precharged with the gates of the switches in all paths held in their memorized states.

Although the '086 patent teaches a CMOS domino circuit having feedback on an output inverter and a series gate between the logic circuit and the inverter, the '086 patent does not include essential elements of Applicants' invention.

U.S. Pat. No. 5,065,048, entitled "Semiconductor Logic Circuit with Noise Suppression Circuit", teaches a dynamic semiconductor logic circuit including an MOS-FET logic section for effecting a high speed logic information in response to input logic signal after precharging of an output mode an internal nodes the logic section, a CMOS output buffer section for outputting a result of the logic operation, and a noise suppression section for preventing erroneous operations without sacrificing the high speed operation characteristic.

Although there are some similarities between the '048 patents circuit and that of the present invention, essential elements of the present invention are not taught nor suggested in the '048 patent.

An article entitled "Design Performance Tradeoffs in CMOS-Domino Logic", by V. G. Oklobdzija and R. K. Montoya, published in the IEEE *Journal of Solid State Circuits*, Vol SC-21 No. 2, April 1986 at p. 304, provides a baseline prior art domino circuit but does not include the inventive aspects of the present invention as described and claimed herein.

Another example of early domino logic circuits is an article entitled "Design Performance Tradeoffs in CMOS-Domino Logic", by V. G. Oklobdzija and R. K. Montoya, published in the *IEEE 1985 Custom Integrated Circuits Conference Proceedings*, at p. 334, which as above shows some early domino logic, but does not teach nor suggest essential elements of the present invention as shown and claimed herein.

An article entitled "An Improvement for Domino CMOS Logic", by C. Zhang, published in *Computer and Electrical Engineering*, Vol. 13, No. 1, pp. 53–59 in 1987, shows another improvement in domino CMOS logic, but does not teach nor suggest essential elements of the present invention as claimed herein.

U.S. Pat. No. 5,041,742, entitled "Structured Scan Path Circuit for Incorporating Domino Logic", teaches a design for a structured scan path circuit incorporating domino logic circuitry. Scan path circuit allows the rapid evaluation of a predetermined logic function, while allowing the use of automatic test pattern generation programs. Each function input signal has its own latch, the equivalent to the master latch in a standard scan flip-flop.

The structure of the circuit of the '742 patent is more complex and requires many latches and other elements which are not required by the present invention as claimed herein.

U.S. Pat. No. 4,849,658, entitled "Dynamic Logic Circuit Including Bipolar Transistors and Field Effect Transistors", teaches a dynamic logic circuit arranged to realize high speed operation. The circuit includes bipolar transistors coupled to CMOS logic including a precharging device coupled between a second potential and the output of the dynamic logic circuit to precharge the output according to at least one clock signal which periodically changes its state.

The '658 patent while teaching a simple CMOS gate circuit with precharging, does not teach not suggest essential elements of the present invention as claimed herein.

U.S. Pat. No. 4,780,626, entitled "Domino Type MOS Logic Gate Having a MOS Subnetwork", teaches a logic MOS gate of the domino type having a precharging transistor, a validation transistor and logic transistors.

The '626 patent teaching relates to a logic gate and does not include essential elements of the present invention as claimed herein.

SUMMARY OF THE INVENTION

Therefore, it is an object of the present invention to provide a domino type logic gate having a high degree of noise immunity and no need for latching signals between half cycle paths.

It is another object of the present invention to provide a domino type logic gate in which forward delay is minimized.

Accordingly, a domino logic circuit includes an evaluation circuit for receiving input signals and performing a logic operation on the input signals, a passgate circuit for controlling the transmission of signals to an output circuit and a feedback latch circuit for holding the output of the evaluation circuit for a predetermined portion of a clock cycle. The output circuit may also include a pair of control transistors to allow the output latching circuit to be turned off during the evaluate portion of the clock cycle thus improving the speed of the domino logic circuit. During the first half of the reset portion of each cycle, the output latching circuit is active and allows the circuit to retain its output state. During the time the passgates are turned off, the evaluate circuit is disconnected and may begin resetting. During the second half of the reset portion of the clocking signal, the passgates open, which allows the output stage to be reset. Since the two additional transistors in the output circuit are controlled by the same signals which control the passgates, the circuit is relatively cheap since only the two transistors must be added to the circuit.

It is a feature of the present invention that the performance of a domino logic circuit may be improved with very little increase in either circuit size or power dissipation.

It is another feature of the present invention that since the domino logic circuit holds its state once the inputs have reset and while the evaluation circuit is resetting, a significant reduction in cycle time is achieved due to removing the requirement for placing a latch between two successive phases of domino precharged logic.

It is yet another feature of the present invention that a single P transistor pull-up may be smaller than would be the case if the pull-up transistor had to accomplish the precharge in a quarter of a clock cycle. This allows the entire circuit to evaluate faster by reducing parasitic capacitance on the internal node while also resulting in a lower cost implementation due to smaller circuit size.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWING

For a more complete understanding of the present invention, and the advantages thereof, reference is now made to the following descriptions taken in conjunction with the accompanying drawings, in which:

FIG. 1 is a circuit diagram of a prior art domino logic circuit.

FIG. 4 is a timing chart of clocking signals controlling the circuits of FIGS. 2 and 3.

DETAILED DESCRIPTION OF PREFERRED EMBODIMENTS OF THE INVENTION

Figure 2:
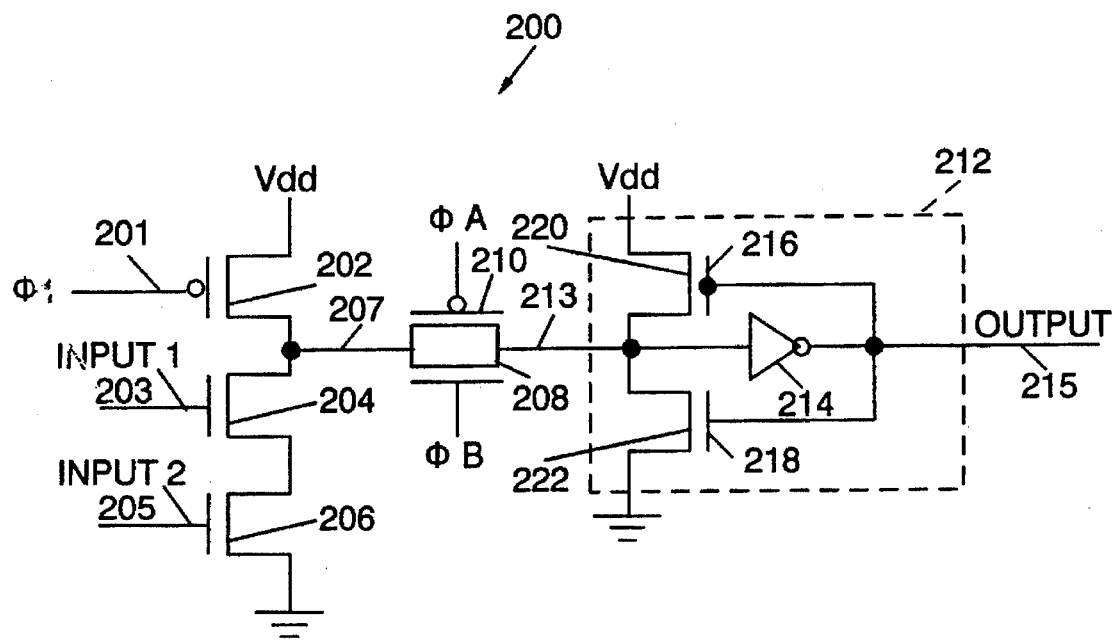
FIG. 2 is a circuit diagram showing a preferred embodiment of the present invention.

Referring now to FIG. 1, a prior art domino logic circuit will be described. A common technique for high performance design of circuits in a data processing system is to use domino or precharged types of logic to speed up evaluation time in critical paths. Typically, this is accomplished by using a two phase clock (See FIG. 4). A clock is usually generated from a phase lock loop (PLL) or a similar circuit, and the logic is split into two portions. The first portion evaluates during the first half cycle and the second portion evaluates during the second half cycle. The circuit for the first portion would then reset during the second half cycle and the circuit for the second portion would reset during the first half cycle.

FIG. 1 shows a prior art domino type AND gate circuit. The circuit requires a latch between logic in the first half cycle and logic in the second half cycle, since the output of the first circuit will begin to reset at the half cycle clock edge, while the second circuit does not begin to evaluate until after the half cycle edge. The circuit also suffers from susceptibility to noise, charge leakage, and DC current flow whenever it is in the evaluate mode when its inputs do not provide a path connecting the internal storage to ground.

A phase 1 clock signal on line 101 is connected to the prior art domino logic circuit 100 to a P-type pull-up transistor 102 and an N-type transistor 104. One terminal of transistor 102 is connected to a voltage source (not shown) and a second terminal of transistor 102 is connected to an output node 103. Output node 103 is also connected to a first terminal of transistor 106 and to gates of transistors 110 and 112 which form the output inverter of the prior art domino logic circuit. Logic inputs 105 and 107 are connected to gates of transistors 106 and 108, respectively. The source of transistor 106 is connected to the drain terminal of transistor 108 and the source terminal of transistor 108 is connected to the drain terminal of transistor 104 which has its source terminal connected to a common point generally referred to as ground. Output inverter transistors 110 and 112 are connected in series with the drain terminal of transistor 112 connected to a voltage source and the source terminal of transistor 112 connected to a drain terminal of transistor 110 and to an output terminal of the domino logic circuit. The source terminal of transistor 110 is connected to the common or ground point.

Figure 3:
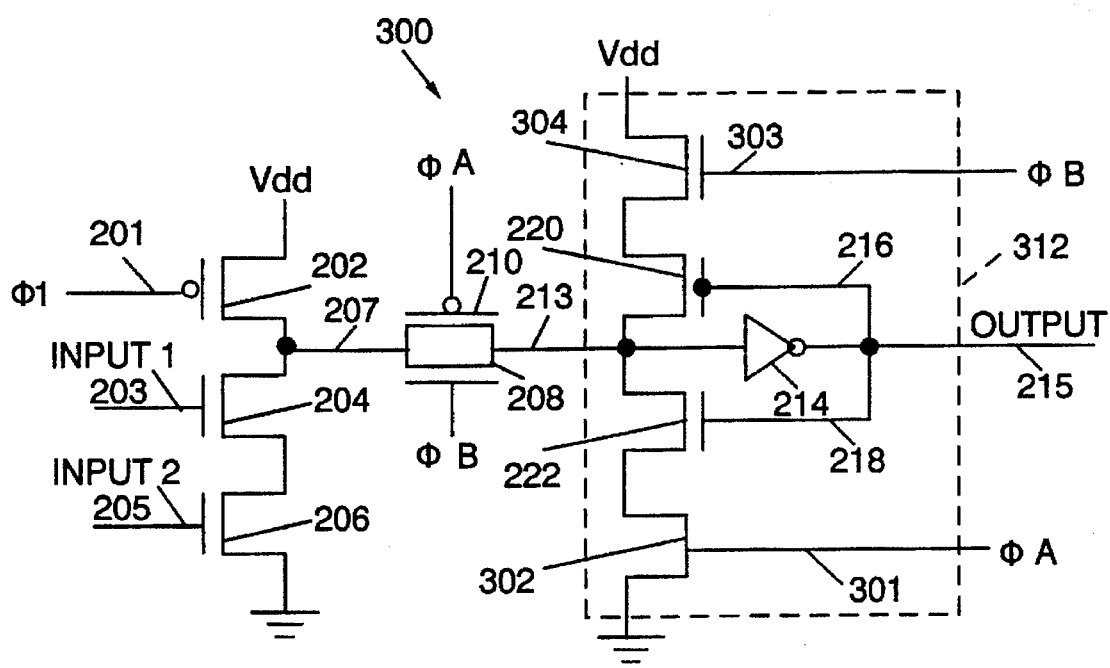
FIG. 3 is a circuit diagram of an alternate embodiment of the present invention.

Referring now to FIGS. 2 and 3, embodiments of the present invention which overcome the deficiencies in the prior art domino logic circuits will be described.

Referring now to FIG. 2, a first embodiment of a domino logic circuit according to the present invention will be described in detail. An evaluation circuit has inputs for a first phase of a clock signal on line 201, a first logic input on line 203, and a second logic input on line 205. Line 201 is connected to the gate of a P-type pull-up device 202 which has its drain connected to a source of voltage $V_{DD}$ and its source connected to a common node 207, also connected to the drain of N-type transistor 204 and to a common connection of drain elements of P-type passgate transistor 210 and N-type passgate transistor 208. A source terminal of transistor 204 is connected to a drain terminal of transistor 206 which has its source terminal connected to a common point or ground. Passgate transistors 208 and 210 have their gates connected to signals phase B for transistor 208 and phase A for transistor 210, respectively. The timing diagram of the phase signals is shown in FIG. 4. The common source elements for transistors 208 and 210 are connected to an input node of feedback inverter circuit 212 on line 213. The feedback inverter circuit includes an inverter 214 having an output connected to the domino logic circuit output 215 and to the gates of P-type transistor 220 and N-type transistor 222. A drain element of P-type transistor 220 is connected to voltage source $V_{DD}$ and a source element is connected to line 213. Transistor 222 has a drain element connected to line 213 and a source element connected to a ground point.

The circuit shown in FIG. 2 in accordance with the present invention differs from the prior art in several aspects. First, the prior art requires the clocking signal to be fed to the gate of an N-type transistor 104 at the bottom of the evaluation chain. No such additional transistor nor connection is required in the circuit according to the present invention. Additionally, a passgate circuit consisting of transistors 208 and 210 controls signal flow between the evaluation circuit and the feedback inverter circuit 212. Additionally, feedback inverter circuit 212 includes feedback transistors 220 and 222 which provide noise immunity and reduce delay in the output circuit while the internal node 207 is being discharged. The addition of passgate transistors 208 and 210 allows the deletion of latch circuit between half cycle edges of the phase 1 clock signal by holding the output on line 213 for an additional quarter cycle, thus providing a significant decrease in path delay. Further, the precharge portion of the circuit requires a half cycle rather than a quarter cycle, thus providing a further speed improvement by reducing the size of p-type pull-up transistor 202.

OPERATION OF THE PREFERRED EMBODIMENT OF THE INVENTION

Referring also to FIG. 4, the timing diagram, the operation of the preferred embodiment of the domino logic circuit 200 with reference to FIG. 2 will be described.

A two-phase clock system includes phase 1 and phase 2 wherein the phase 2 clock and signal is delayed a quarter cycle from phase 1. The phase 1 and phase 2 clock signals are used to generate the phase A and phase B signals used in preferred embodiments of the present invention phase 1 and phase 2 clock signals are connected to respective inputs of a circuit (not shown) which produces a high output when φ1 is low and φ2 is high. Thus, phase A high signal results when phase 1 drops at the end of the first half cycle while phase 2 signal is still high. Then, when phase 2 drops while phase 1 is still low, the phase A signal drops since phase 1 and phase 2 are then at the same level. Phase B is the inverse of phase A.

At the beginning of a cycle of clock signal phase 1, the internal node 207 is precharged, pull-up transistor 202 is turned off, and the circuit is in an evaluate mode for evaluating logic inputs on lines 203 and 205. Complimentary passgate transistors 208 and 210 are on, providing a path between internal node 207 and the feedback inverter circuit 212. The P-type feedback transistor 220 maintains internal node on line 213 at a full $V_{DD}$ voltage. If the inputs on lines 203 and 205 are such that a path to ground is provided, internal node 207 will be quickly discharged. P-type feedback transistor 220 also allows feedback inverter 212 to operate in a shorter time by sizing transistor 220 to be much larger than N-type transistor 222, which effectively raises the switching point of inverter 212 so that it will switch at an earlier point-in-time. As output node 215 begins to switch, P transistor 220 is turned off and N-transistor 222 is turned on, further accelerating the discharge of the internal node 207 and the speed of inverter 212. Once internal node 217 is fully discharged, transistor 222 maintains node 213 at ground potential even after inputs 203 and 205 cease to be active. At the end of a first half cycle, the evaluate path is interrupted by turning passgates 208 and 210 off and precharge device 202 is turned on. Note that precharge device 202 is driven by a half cycle clock while passgates 208 and 210 are driven by clocks which cause them to turn off during the third quarter of each cycle. (See FIG. 4) Thus, they are turned off at the time when the evaluate has been completed, and the circuit is beginning to enter the reset phase. Feedback devices 220 and 222 insure that the output on line 215 is maintained in a valid state for a further one-fourth of a cycle, providing time for the next stage of logic to be computed and its output to be set. During this third quarter of a cycle, the first stage of a circuit (the evaluation stage) is resetting and the internal node on line 207 is being precharged to a voltage $V_{DD}$. At the end of the third quarter, passgates 208 and 210 are turned on, connecting the internal node 207 to the input of the inverter on line 213. At this point, inverter 212 begins to switch to a reset state while precharge device 202 continues to pull-up internal node 207 to a full $V_{DD}$. The feedback P transistor 220 helps in this process once inverter output on line 215 has dropped sufficiently to turn on transistor 220 and turn off N-type transistor 222. At the end of the last quarter cycle, the circuit is reset and P-type precharge device 202 is turned off, making 200 ready for the next evaluation cycle.

Referring now to FIG. 3, an alternate embodiment of the present invention will be described in greater detail. Domino logic circuit 300 has an evaluation section and a passgate section that are the same as domino logic circuit 200 described above with reference to FIG. 2. Domino logic circuit 300 adds transistors 302 and 304 in the feedback inverter circuit 312. N-type transistor 302 is connected between the source of N-type transistor 222 and ground with the drain of transistor 302 connected to the source of transistor 222 and the source of transistor 302 connected to ground. The gate of N-type transistor 302 is connected to the phase A signal which is also input to the gate of P-type passgate transistor 210. P-type transistor 304 has its drain connected to voltage source $V_{DD}$ and has its source to the drain of P-type transistor 220. The gate of P-type transistor 304 is connected to phase B on line 303 which is the same input as to the gate of passgate transistor 208. Additional transistors 302 and 304 allow the feedback inverter circuit 312 to be turned off during the evaluate portion of each cycle, thus allowing an improvement in the speed of the circuit. During the first half of the reset portion of the cycle, the circuit behaves as described above with reference to FIG. 2, that is, feedback inverter 312 is active and allows the circuit to retain its output state on output line 215. During this time, passgate transistors 208 and 210 are turned off so that the evaluate tree is disconnected from the feedback inverter 312 and may begin resetting. During the second half of the reset portion of the cycle, passgate transistors 208 and 210 are turned on (see FIG. 4 for clock waveforms) which allows feedback inverter 312 to be reset. Since added transistors 302 and 304 are controlled by the same signals which control passgate transistors 208 and 210, no new inputs are required to the circuit and the cost is limited to the cost of the transistors 202 and 204. Also, these transistors can be quite small, and in fact, it is desirable to make them small to avoid impacting the amount of time needed to reset the circuit.

Although the present invention and its advantages have been described in detail, it should be understood that various changes, substitutions and alterations can be made herein without departing from the spirit and scope of the invention as defined by the appended claims.

What is claimed is:

1. A logic circuit for use in a data processing system, comprising:

an evaluation circuit for evaluating logic inputs to said logic circuit;

a passgate circuit for controlling transmission of an output from said evaluation circuit to an output circuit;

a feedback latch output circuit having a clock signal input for holding said output of said evaluation circuit for a predetermined portion of a clock cycle; and wherein said evaluation circuit comprises:

a p type precharge transistor having a first terminal thereof connected to a voltage source and a second terminal connected to said output and a terminal of an n type evaluation transistor, and having a third terminal receiving a clock signal; and one or more n type evaluation transistors connected between said p type precharge transistor and a common return, each of said n type evaluation transistors having an input receiving a logic signal to be evaluated.

2. A logic circuit for use in a data processing system comprising:

an evaluation circuit for evaluating logic inputs to said logic circuit;

a passgate circuit for controlling transmission of an output from said evaluation circuit to an output circuit;

a feedback latch output circuit having a clock signal input for holding said output of said evaluation circuit for a predetermined portion of a clock cycle; and wherein said passgate circuit comprises:

a complementary pair of transistors connected between said output of said evaluation circuit and an input to said feedback latch output circuit.

3. A logic circuit for use in a data processing system, comprising:

an evaluation circuit for evaluating logic inputs to said logic circuit;

a passgate circuit for controlling transmission of an output from said evaluation circuit to an output circuit;

a feedback latch output circuit for holding said output of said evaluation circuit for a predetermined portion of a clock cycle; and wherein said feedback latch output circuit comprises:

an inverter circuit having an input connected to an output of said passgate circuit and an output, said output connected to control terminals of first and second feedback transistors;

said first feedback transistor being a p type transistor having one terminal thereof connected to a voltage source and a second terminal thereof connected to said input of said inverter circuit; and said second feedback transistor being an n type transistor having one terminal thereof connected to a common return and a second terminal thereof connected to said input of said inverter circuit; and wherein said feedback latch output circuit further comprises:

a third feedback transistor being a p type transistor having one terminal thereof connected between said voltage source and said one terminal of said first feedback transistor, and a control terminal thereof connected to a first clock cycle control signal; and a fourth transistor being an n type transistor having one terminal thereof connected between said one terminal of said second feedback transistor and said common return, and a control terminal thereof connected to a second clock cycle control signal.

4. A logic circuit for use in a data processing system, comprising:

an evaluation circuit for evaluating logic inputs to said logic circuit;

a passgate circuit for controlling transmission of an output from said evaluation circuit to an output circuit; and a feedback latch output circuit having a clock signal input for holding said output of said evaluation circuit for a predetermined portion of a clock cycle.

* * * * *